United States Patent
Subramani et al.

(10) Patent No.: US 9,853,579 B2
(45) Date of Patent: Dec. 26, 2017

(54) ROTATABLE HEATED ELECTROSTATIC CHUCK

(71) Applicant: APPLIED MATERIALS, INC., Santa Clara, CA (US)

(72) Inventors: Anantha K. Subramani, San Jose, CA (US); Ashish Goel, Bangalore (IN); Wei W. Wang, Santa Clara, CA (US); Bharath Swaminathan, San Jose, CA (US); Vijay D. Parkhe, San Jose, CA (US); Xiaoxiong Yuan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 604 days.

(21) Appl. No.: 14/560,744

(22) Filed: Dec. 4, 2014

(65) Prior Publication Data
US 2015/0170952 A1   Jun. 18, 2015

Related U.S. Application Data

(60) Provisional application No. 61/917,921, filed on Dec. 18, 2013.

(51) Int. Cl.
*H02N 13/00* (2006.01)
*H01L 21/683* (2006.01)
(Continued)

(52) U.S. Cl.
CPC ....... *H02N 13/00* (2013.01); *H01J 37/32091* (2013.01); *H01J 37/32715* (2013.01);
(Continued)

(58) Field of Classification Search
CPC .. H02N 13/00; H01L 21/6831; H01L 21/6833
See application file for complete search history.

(56) References Cited

U.S. PATENT DOCUMENTS 6,074,512 A * 6/2000 Collins ................. C23C 16/517
                                                118/723 AN
6,462,928 B1 * 10/2002 Shamouilian ....... H01L 21/6833
                                                361/234
(Continued)

FOREIGN PATENT DOCUMENTS

JP         2003-133233 A       5/2003

OTHER PUBLICATIONS

International Search Report and Written Opinion dated Mar. 25, 2015 for PCT Application No. PCT/US2014/069040.

*Primary Examiner* — Stephen W Jackson
*Assistant Examiner* — Christopher Clark
(74) *Attorney, Agent, or Firm* — Moser Taboada; Alan Taboada

(57) ABSTRACT

An electrostatic chuck includes a dielectric disk having a support surface to support a substrate and an opposing second surface, wherein at least one chucking electrode is disposed within the dielectric disk; a radio frequency (RF) bias plate disposed below the dielectric disk; a plurality of lamps disposed below the RF bias plate to heat the dielectric disk; a metallic plate disposed below the lamps to absorb heat generated by the lamps; a shaft coupled to the second surface of the dielectric disk at a first end of the shaft to support the dielectric disk in a spaced apart relation to the RF bias plate and extending away from the dielectric disk and through the RF bias plate and the metallic plate; and a rotation assembly coupled to the shaft to rotate the shaft and the dielectric disk with respect to the RF bias plate, lamps, and metallic plate.

20 Claims, 4 Drawing Sheets

(51) Int. Cl.
*H01L 21/67* (2006.01)
*H01L 21/687* (2006.01)
*H01J 37/32* (2006.01)

(52) U.S. Cl.
CPC .. *H01J 37/32724* (2013.01); *H01L 21/67103* (2013.01); *H01L 21/67115* (2013.01); *H01L 21/6831* (2013.01); *H01L 21/68742* (2013.01); *H01L 21/68792* (2013.01)

(56) References Cited

U.S. PATENT DOCUMENTS

| | | | | |
|---|---|---|---|---|
| 8,920,562 B2* | 12/2014 | Ikeda | ................... | C23C 14/042 118/50.1 |
| 2002/0104205 A1 | 8/2002 | Goodwin | | |
| 2003/0043530 A1* | 3/2003 | Kwon | ................ | H01L 21/6833 361/234 |
| 2003/0154922 A1* | 8/2003 | House | ................ | C23C 16/4581 118/725 |
| 2003/0169553 A1* | 9/2003 | Brown | ................... | H02N 13/00 361/234 |
| 2004/0261946 A1* | 12/2004 | Endoh | ............... | H01J 37/32082 156/345.15 |
| 2008/0084650 A1* | 4/2008 | Balasubramanian | ... | C23C 16/52 361/234 |
| 2008/0149598 A1* | 6/2008 | Hayashi | ........... | H01J 37/32522 216/67 |
| 2012/0222618 A1* | 9/2012 | Olsen | ................... | C23C 16/517 118/723 MP |
| 2013/0052834 A1 | 2/2013 | Kielwein et al. | | |
| 2014/0099795 A1* | 4/2014 | Tobin | ................ | H01L 21/31116 438/715 |
| 2014/0334059 A1* | 11/2014 | Miyazawa | ........ | H01L 21/68757 361/234 |
| 2014/0335697 A1* | 11/2014 | Indrakanti | ......... | H01L 21/76811 438/714 |
| 2015/0049410 A1* | 2/2015 | Ono | ....................... | H02N 13/00 361/234 |

\* cited by examiner

ROTATABLE HEATED ELECTROSTATIC CHUCK

CROSS-REFERENCE TO RELATED APPLICATIONS

This application claims benefit of U.S. provisional patent application Ser. No. 61/917,921, filed Dec. 18, 2013, which is herein incorporated by reference in its entirety.

FIELD

Embodiments of the present disclosure generally relate to electrostatic chucks used to retain substrates in microelectronic device fabrication processes.

BACKGROUND

Formation of some devices on substrates (e.g., STT-RAM) requires multiple layers of thin films which are deposited in a deposition chamber, such as a physical vapor deposition (PVD) chamber. In some embodiments, the substrate needs to be rotated during the deposition process to obtain good film uniformity. Deposition of some layers may also require the substrate to be heated. Further, the deposition process requires a high vacuum pressure. An electrostatic chuck is often used to electrostatically retain a substrate on a substrate support during the deposition process. Conventionally, an electrostatic chuck comprises a ceramic body having one or more electrodes disposed therein. Typical electrostatic chucks only move vertically up and down to facilitate substrate transfers. However, the inventors have observed that such a movement limitation prevents using these conventional electrostatic chucks for off-axis deposition due to non-uniform deposition on the substrate.

Therefore, the inventors have provided embodiments of an improved rotatable heated electrostatic chuck.

SUMMARY

Embodiments of rotatable, heated electrostatic chucks have been provided herein. In some embodiments, an electrostatic chuck includes: a dielectric disk having a support surface to support a substrate and an opposing second surface, wherein at least one chucking electrode is disposed within the dielectric disk; a radio frequency (RF) bias plate disposed below the dielectric disk; a plurality of lamps disposed below the RF bias plate to heat the dielectric disk; a metallic plate disposed below the plurality of lamps to absorb heat generated by the plurality of lamps; a shaft coupled to the second surface of the dielectric disk at a first end of the shaft to support the dielectric disk in a spaced apart relation to the RF bias plate and extending away from the dielectric disk and through the RF bias plate and the metallic plate; and a rotation assembly coupled to the shaft to rotate the shaft and the dielectric disk with respect to the RF bias plate, the plurality of lamps, and the metallic plate.

In some embodiments, an electrostatic chuck includes: a dielectric disk having a support surface to support a substrate and an opposing second surface, wherein at least one chucking electrode is disposed within the dielectric disk; a radio frequency (RF) bias plate disposed below the dielectric disk; an inductor filter disposed in a conductor coupled to the at least one chucking electrode to minimize RF interference with the at least one chucking electrode; a plurality of lamps disposed below the RF bias plate to heat the dielectric disk; a metallic plate disposed below the plurality of lamps to absorb heat generated by the plurality of lamps; a shaft coupled to the second surface of the dielectric disk at a first end of the shaft to support the dielectric disk in a spaced apart relation to the RF bias plate and extending away from the dielectric disk and through the RF bias plate and the metallic plate; and a magnetic rotation assembly coupled to the shaft to rotate the shaft and the dielectric disk with respect to the RF bias plate, the plurality of lamps, and the metallic plate, wherein the magnetic rotation assembly includes an inner magnet attached to a lower portion of the shaft proximate to a second end of the shaft opposite the first end and an outer magnet disposed about the inner magnet to drive the rotation of the inner magnet.

In some embodiments, an electrostatic chuck includes: a dielectric disk having a support surface to support a substrate and an opposing second surface, wherein at least one chucking electrode is disposed within the dielectric disk; a radio frequency (RF) bias plate disposed below the dielectric disk; a plurality of lamps disposed below the RF bias plate to heat the dielectric disk; a metallic plate disposed below the plurality of lamps to absorb heat generated by the plurality of lamps; a housing containing the RF bias plate, the plurality of lamps, and the metallic plate; a gap disposed between an outer diameter of the metallic plate and an inner surface of the housing, wherein the gap is sized such that when the metallic plate absorbs heat from the plurality of lamps, thermal expansion of the metallic plate causes the outer diameter of the metallic plate to contact the inner surface of the housing; a shaft coupled to the second surface of the dielectric disk at a first end of the shaft to support the dielectric disk in a spaced apart relation to the RF bias plate and extending away from the dielectric disk and through the RF bias plate and the metallic plate; and a magnetic rotation assembly coupled to the shaft to rotate the shaft and the dielectric disk with respect to the RF bias plate, the plurality of lamps, and the metallic plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of rotatable, heated electrostatic chucks are provided herein. The inventive electrostatic chucks may advantageously be rapidly heated and cooled (simultaneously with the rapid heating and cooling of a substrate disposed thereon), thereby providing process flexibility and increased throughput in substrate processing. Embodiments of the inventive electrostatic chuck may also advantageously reduce or eliminate damages to the substrate resulting from friction due to differences in thermal expansion of a substrate and electrostatic chuck during processing.

Figure 1:
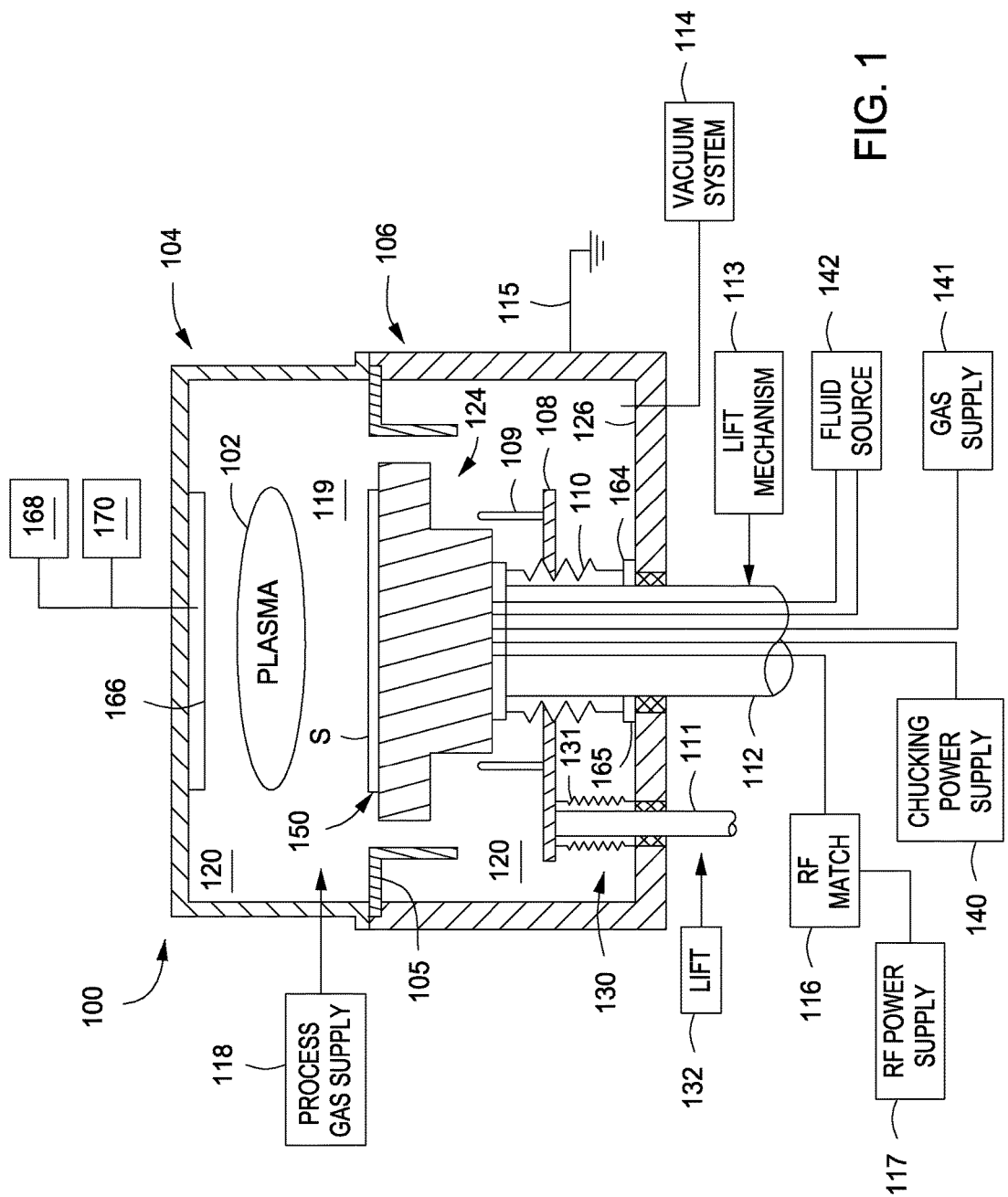
FIG. 1 depicts a process chamber suitable for use with an electrostatic chuck in accordance with some embodiments of the present disclosure.

FIG. 1 is a schematic cross-sectional view of plasma processing chamber in accordance with some embodiments of the present disclosure. In some embodiments, the plasma processing chamber is a physical vapor deposition (PVD) processing chamber. However, other types of processing chambers can also use or be modified for use with embodiments of the inventive electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate S, such as a semiconductor wafer, for example, or other such substrate as may be electrostatically retained. The substrate support 124 may generally comprise an electrostatic chuck 150 (described in more detail below with respect to FIGS. 2-4) and a hollow support shaft 112 for supporting the electrostatic chuck 150. The hollow support shaft 112 provides a conduit to provide, for example, process gases, fluids, coolants, power, or the like, to the electrostatic chuck 150.

In some embodiments, the hollow support shaft 112 is coupled to a lift mechanism 113 which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts bottom surface 126 to help prevent loss of chamber vacuum.

The hollow support shaft 112 provides a conduit for coupling a fluid source 142, a gas supply 141, a chucking power supply 140, and RF sources (e.g., RF plasma power supply 170 and RF bias power supply 117) to the electrostatic chuck 150. In some embodiments, RF plasma power supply 170 and RF bias power supply 117 are coupled to the electrostatic chuck via respective RF match networks (only RF match network 116 shown).

A substrate lift 130 may include lift pins 109 mounted on a platform 108 connected to a shaft 111 which is coupled to a second lift mechanism 132 for raising and lowering the substrate lift 130 so that the substrate "S" may be placed on or removed from the electrostatic chuck 150. The electrostatic chuck 150 includes thru-holes (described below) to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes proximate to or within the chamber interior volume 120 to ignite the process gas and creating the plasma 102. In some embodiments, a bias power may also be provided from a bias power supply (e.g., RF bias power supply 117) to one or more electrodes (described below) disposed within the electrostatic chuck 150 via a capacitively coupled bias plate (described below) to attract ions from the plasma towards the substrate S.

In some embodiments, for example where the chamber 100 is a PVD chamber, a target 166 comprising a source material to be deposited on a substrate S may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a negative voltage, or bias, to the target 166. The RF bias power supply 117 may be coupled to the substrate support 124 in order to induce a negative DC bias on the substrate S. In addition, in some embodiments, a negative DC self-bias may form on the substrate S during processing. In some embodiments, an RF plasma power supply 170 may also be coupled to the chamber 100 to apply RF power to the target 166 to facilitate control of the radial distribution of a deposition rate on substrate S. In operation, ions in the plasma 102 created in the chamber 100 react with the source material from the target 166. The reaction causes the target 166 to eject atoms of the source material, which are then directed towards the substrate S, thus depositing material.

Figure 2:
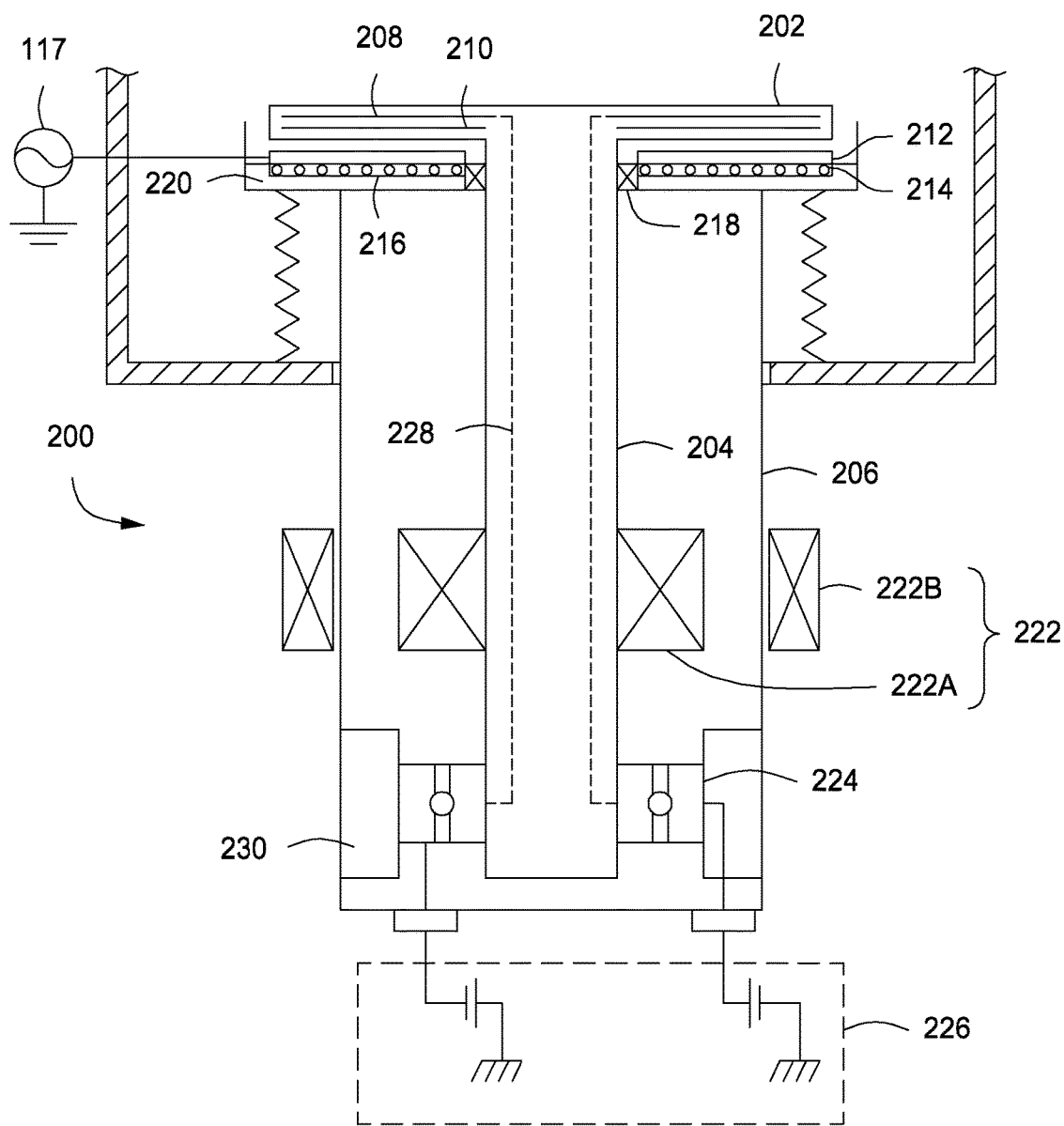
FIG. 2 depicts a cross sectional view of an electrostatic chuck in accordance with some embodiments of the present disclosure.

FIG. 2 depicts a cross-sectional view of an electrostatic chuck (chuck 200) in accordance with embodiments of the present disclosure. The chuck 200 includes a disk 202, a shaft 204 extending from the bottom of the disk 202, and a housing 206 enclosing the disk 202, the shaft 204, and all the components (described below) of the chuck 200.

The disk 202 is formed of a dielectric material, such as a ceramic material, for example, aluminum nitride, aluminum oxide, boron nitride, alumina doped with titanium oxide, and the like. The disk 202 includes one or more chucking electrodes 208 disposed near an upper surface of the disk 202. The one or more chucking electrodes 208 are fabricated from a suitable conductive material, such as molybdenum, titanium, or the like. The one or more chucking electrodes 208 may be arranged in any configuration that will sufficiently secure the substrate to the upper surface of the disk during processing. For example, the one or more chucking electrodes 208 may be arranged to provide a single electrode electrostatic chuck, a bipolar electrostatic chuck, or the like.

As noted above, the disk 202 may also include one or more RF bias electrodes 210. The one or more RF bias electrodes 210 are capacitively coupled to RF power to attract ions from the plasma towards the substrate disposed on the disk 202. Power is delivered to the RF bias electrodes 210 via an RF bias plate 212 disposed below the disk 202 that receives power from an external RF power source (e.g., RF bias power supply 117). The RF bias plate 212 is capacitively coupled to the RF bias electrodes 210, thereby removing any direct electrical coupling across a conductor. Accordingly, power can be delivered to the RF bias electrodes 210 while the disk 202 is being rotated.

To facilitate heating of the disk 202 and a substrate when disposed thereon, the chuck 200 includes a lamp housing 216, which includes a plurality of lamps 214, disposed beneath the RF bias plate 212. The lamp housing 216 is formed of a material capable of withstanding the heat of the plurality of lamps 214. For example, the lamp housing 216 may be formed of a ceramic material. The plurality of lamps 214 includes any type of lamp capable of emitting enough heat to heat the disk 202 via radiation. For example, the plurality of lamps 214 may include halogen lamps. To allow the heat generated by the plurality of lamps 214 to reach the disk 202, the RF bias plate 212 includes slots in positions corresponding to positions of the plurality of lamps 214, as shown in more detail in FIG. 4.

The chuck 200 may also include a bearing 218 located proximate to the disk 202 (for example, within about 3 inches of the disk 202) to provide increased rigidity to the chuck 200 during rotation. The bearing 218 may include, for example, a cross roller bearing, or the like. A metallic plate 220 is disposed beneath the lamp housing 216 to conduct heat away from the bearing 218 which could otherwise cause the bearing to expand and eventually seize. The metallic plate 220 may be formed of any process compatible metal or metal alloy such as, for example, aluminum. The metallic plate 220 is sized so that a gap is disposed between an outer edge of the metallic plate 220 and an inner surface of the housing 206. During operation of the chuck 200, the heat generated by the plurality of lamps 214 heats the metallic plate 220 causing it to expand such that the outer diameter, or edge, of the metallic plate 220 contacts the inner surface of the housing 206. Upon contacting the inner surface of the housing 206, the metallic plate 220 readily transfers heat to the housing 206 through conduction. Fluid channels (described below) may be disposed in the housing 206 to flow a heat transfer fluid (e.g., a coolant) to cool the housing 206.

The chuck 200 further includes a magnetic drive assembly 222 to rotate the disk 202. The magnetic drive assembly 222 includes an inner magnet 222A and an outer magnet 222B. The inner magnet 222A is attached, or fixed, to the shaft 204. In some embodiments, the inner magnet 222A is attached to a lower portion of the shaft 204 proximate an end of the shaft 204 opposite the disk 202. The outer magnet 222B is disposed outside of the housing 206 proximate to the inner magnet 222A. The outer magnet 222B may be driven by a suitable mechanism, for example by a belt drive or a motor, to drive the inner magnet 222A, and the shaft 204 and the disk 202. Because the inner magnet 222A is disposed within the housing 206, it is at vacuum pressure and because the outer magnet 222B is disposed outside of the housing 206, it is at atmospheric pressure. However, both the inner magnet 222A and the outer magnet 222B may instead be disposed within the housing 206. Thus, the magnetic drive assembly 222 rotates the disk 202 and the shaft 204 with respect to the process chamber and the remaining components of the chuck 200 which remain stationary (e.g., the housing 206, the lamp housing 216, the metallic plate 220, the RF bias plate 212, and the like). Alternatively, the magnetic drive assembly 222 can use other configurations to rotate the disk 202 and the shaft 204. For example, in some embodiments, the inner magnet 222A and the outer magnet 222B can function respectively as a rotor and stator with a conductor wrapped around the stator to electromagnetically drive the rotor.

The chuck 200 also includes a bearing assembly 224 located at an end of the shaft 204 opposite the disk 202. The bearing assembly 224 supports the shaft 204 and facilitates rotation of the shaft 204. In addition, the inventors have provided an improved way to route power to the chucking electrodes 208 through the bearing assembly 224 to facilitate providing power to the chucking electrodes 208 while rotating the chuck 200. Power is drawn from a DC power source 226 through connections in the housing 206 and routed to the bearing assembly 224. Current flows through the bearing assembly 224 and is subsequently routed to the chucking electrodes 208 via chucking power lines 228 disposed within an interior of the shaft 204. In order to avoid any interference with the chucking power supply (e.g., the DC power source 226), the bearing assembly may be coupled to an insulator 230, which is coupled to an interior of the housing 206.

Figure 3:
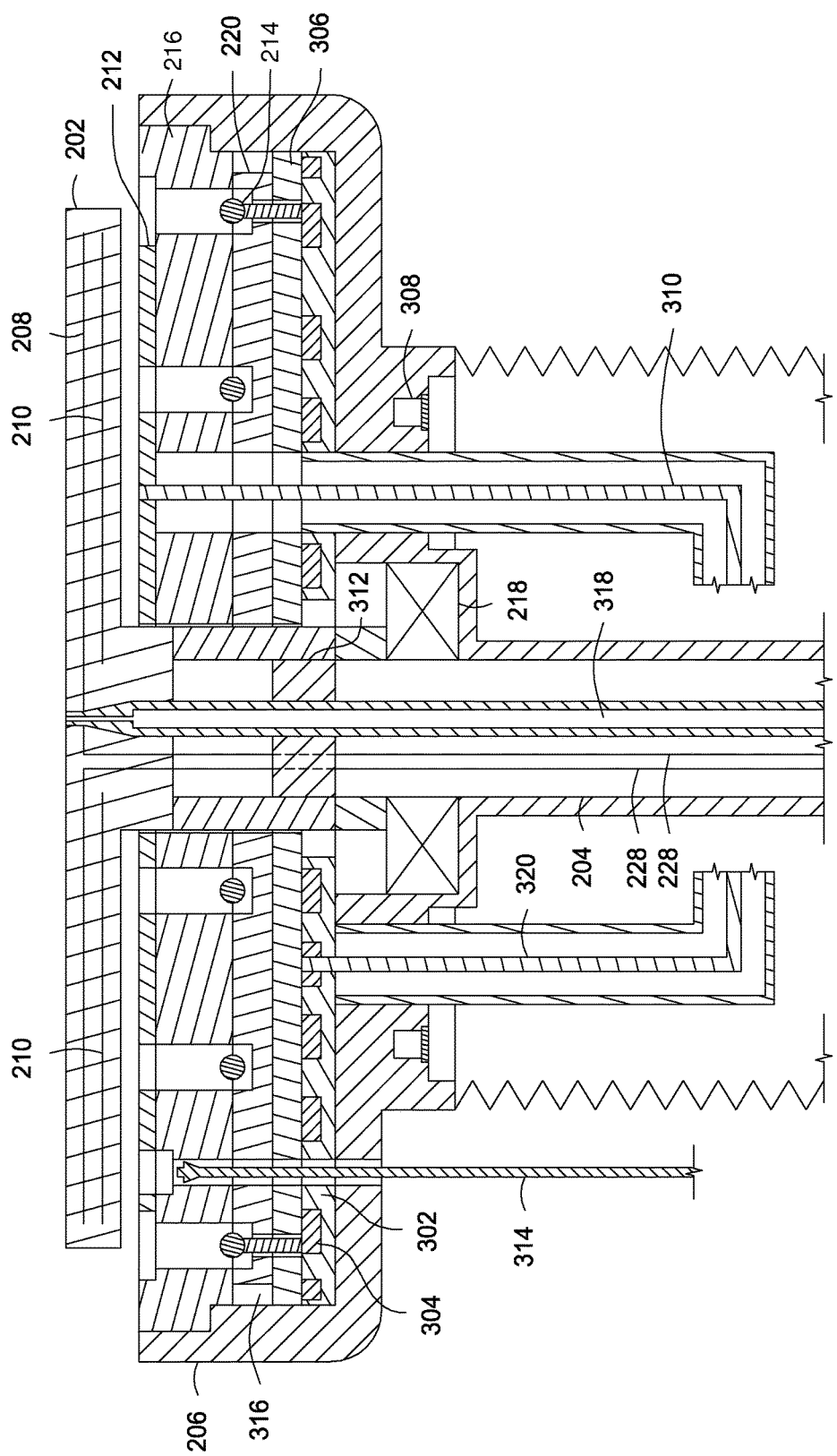
FIG. 3 depicts a cross sectional view of an upper portion of an electrostatic chuck in accordance with some embodiments of the present disclosure.
Figure 4:
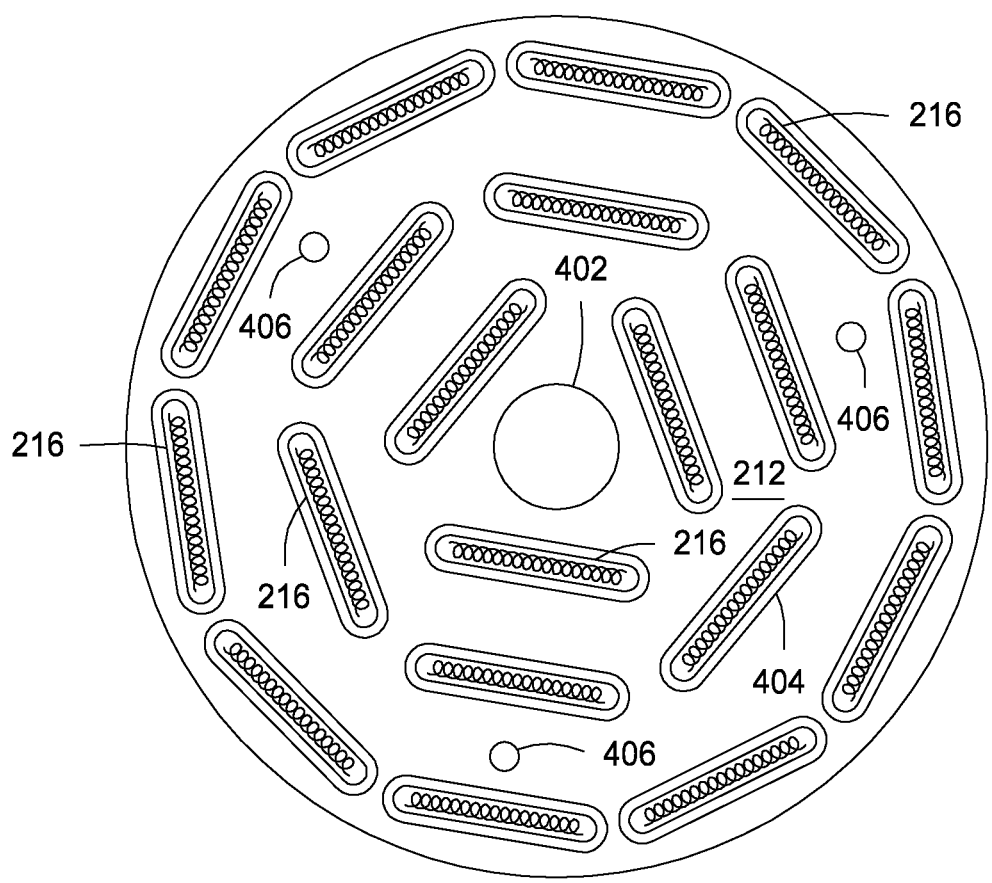
FIG. 4 depicts a top view of a radio frequency (RF) bias plate and substrate heating apparatus in accordance with some embodiments of the present disclosure.

Referring to the cross sectional view of the chuck 200 in FIG. 3, the plurality of lamps 214 receive power from a plurality of conductors 304 disposed in a dielectric plate 302, such as a ceramic plate. The conductors 304 may receive power from the DC power source 226 or from another power supply (not shown) via heater power lines (e.g., conductors) 320. In some embodiments, a dielectric layer 306 may be disposed atop the dielectric plate 302 to protect the conductors 304 and prevent inadvertent contact between the conductors 304 and any other conductive elements of the chuck 200. Openings in the dielectric layer 306 are provided to facilitate coupling the conductors 304 to respective lamps 214. In some embodiments, the plurality of lamps may be divided into a plurality of zones, for example, an inner array of lamps and an independently controllable outer array of lamps, as illustrated in FIG. 4.

As explained above, upon activation of the plurality of lamps 214, heat is generated and the disk 202 is heated. Because the heat is emitted in every direction, and not only towards the disk 202, the metallic plate 220 is disposed below the lamp housing 216 to absorb the heat. During the absorption process, the metallic plate 220 expands and begins to extend into a gap 316 between an outer edge of the metallic plate 220 and the housing 206. Upon contacting the housing 206, the metallic plate 220 transfers heat to the housing 206. To keep the housing 206 cool, a plurality of fluid channels 308 are formed in the housing 206. Any suitable coolant (e.g., water, propylene glycol, or the like) may be flowed through the fluid channels 308 to cool the housing 206.

The RF bias plate 212 may receive its power from the RF bias power supply 117 or from another power source (not shown) via RF power lines (e.g., conductors) 310. In order to prevent interference of the RF waves with the chucking power supply, the chuck 200 includes an inductor filter 312. The inductor filter 312 surrounds the chucking power lines 228 to filter out the RF waves.

In order to facilitate placement and removal of a substrate on the disk 202, the chuck 200 may also include a lift pin assembly including a plurality of lift pins 314 to raise and lower a substrate off of or onto the disk 202. In some embodiments, at least one of the plurality of lift pins 314 may include a pyrometer to measure the temperature of the disk 202. A region of the disk 202 disposed opposite the lift pins 314 may be treated to have a very high emissivity to facilitate monitoring the temperature of the disk 202 by the pyrometer In some embodiments, the shaft 204 may also include a conduit 318 for providing backside gases through the disk 202 to a backside of the substrate when disposed on the disk 202 during processing. The conduit 318 may be fluidly coupled to the gas supply 141, described above with respect to FIG. 1.

FIG. 4 depicts a top view of an RF bias plate and substrate heating apparatus in accordance with some embodiments of the present disclosure. FIG. 4 illustrates the RF bias plate 212 including a plurality of openings 404 corresponding to positions of the plurality of lamps 214. As explained above, the plurality of openings 404 allow heat generated by the plurality of lamps 214 to heat the disk 202. The RF bias plate 212 and the lamp housing 216 also include a central hole 402 to allow the shaft 204 to pass therethrough and a plurality of holes 406 to allow the plurality of lift pins 314 to pass therethrough. Although shown as slots arranged in a particular configuration, the shape and number of the openings, as well as the shape and number of the lamps, may be varied to provide a desired heat profile on the disk 202.

While the foregoing is directed to embodiments of the present disclosure, other and further embodiments of the disclosure may be devised without departing from the basic scope thereof.

The invention claimed is:

1. An electrostatic chuck, comprising:
    a dielectric disk having a support surface to support a substrate and an opposing second surface, wherein at least one chucking electrode is disposed within the dielectric disk;
    a radio frequency (RF) bias plate disposed below the dielectric disk;
    a plurality of lamps disposed below the RF bias plate to heat the dielectric disk;
    a metallic plate disposed below the plurality of lamps to absorb heat generated by the plurality of lamps;
    a shaft coupled to the second surface of the dielectric disk at a first end of the shaft to support the dielectric disk in a spaced apart relation to the RF bias plate and extending away from the dielectric disk and through the RF bias plate and the metallic plate; and
    a rotation assembly coupled to the shaft to rotate the shaft and the dielectric disk with respect to the RF bias plate, the plurality of lamps, and the metallic plate.

2. The electrostatic chuck of claim 1, wherein the electrostatic chuck is a bipolar electrostatic chuck.

3. The electrostatic chuck of claim 1, further comprising:
    a housing containing the RF bias plate, the plurality of lamps, and the metallic plate.

4. The electrostatic chuck of claim 3, further comprising:
    a gap disposed between an outer diameter of the metallic plate and an inner surface of the housing, wherein the gap is sized such that when the metallic plate absorbs heat from the plurality of lamps, thermal expansion of the metallic plate causes the outer diameter of the metallic plate to contact the inner surface of the housing.

5. The electrostatic chuck of claim 1, wherein the RF bias plate is disposed between the dielectric disk and the plurality of lamps.

6. The electrostatic chuck of claim 5, wherein the RF bias plate includes a plurality of openings to allow heat emitted from the plurality of lamps to heat the dielectric disk.

7. The electrostatic chuck of claim 1, wherein the plurality of lamps include halogen lamps.

8. The electrostatic chuck of claim 1, wherein the plurality of lamps include an inner array of lamps and an independently controllable outer array of lamps.

9. The electrostatic chuck of claim 1, wherein the rotation assembly is a magnetic rotation assembly.

10. The electrostatic chuck of claim 9, wherein the magnetic rotation assembly includes an inner magnet attached to a lower portion of the shaft proximate to a second end of the shaft opposite the first end and an outer magnet disposed about the inner magnet to drive the rotation of the inner magnet.

11. The electrostatic chuck of claim 1, further comprising:
    a bearing assembly disposed about the shaft.

12. The electrostatic chuck of claim 11, wherein the bearing assembly is electrically coupled to the chucking electrode such that power can be fed through the bearing assembly to provide power to the at least one chucking electrode.

13. The electrostatic chuck of claim 1, further comprising:
    an inductor filter disposed in a conductor coupled to the at least one chucking electrode to minimize RF interference with the at least one chucking electrode.

14. The electrostatic chuck of claim 1, further comprising:
    a lift pin assembly including a plurality of lift pins movably disposed through the support surface of the dielectric disk.

15. The electrostatic chuck of claim 14, wherein at least one of the plurality of lift pins includes a pyrometer to measure a temperature of the dielectric disk.

16. The electrostatic chuck of claim 1, further comprising:
    a bearing disposed about the shaft and proximate to the dielectric disk.

17. An electrostatic chuck, comprising:
    a dielectric disk having a support surface to support a substrate and an opposing second surface, wherein at least one chucking electrode is disposed within the dielectric disk;
    a radio frequency (RF) bias plate disposed below the dielectric disk;
    an inductor filter disposed in a conductor coupled to the at least one chucking electrode to minimize RF interference with the at least one chucking electrode;
    a plurality of lamps disposed below the RF bias plate to heat the dielectric disk;
    a metallic plate disposed below the plurality of lamps to absorb heat generated by the plurality of lamps;
    a shaft coupled to the second surface of the dielectric disk at a first end of the shaft to support the dielectric disk in a spaced apart relation to the RF bias plate and extending away from the dielectric disk and through the RF bias plate and the metallic plate; and a magnetic rotation assembly coupled to the shaft to rotate the shaft and the dielectric disk with respect to the RF bias plate, the plurality of lamps, and the metallic plate, wherein the magnetic rotation assembly includes an inner magnet attached to a lower portion of the shaft proximate to a second end of the shaft opposite the first end and an outer magnet disposed about the inner magnet to drive the rotation of the inner magnet.

18. The electrostatic chuck of claim 17, further comprising:

a housing containing the RF bias plate, the plurality of lamps, and the metallic plate; and a gap disposed between an outer diameter of the metallic plate and an inner surface of the housing, wherein the gap is sized such that when the metallic plate absorbs heat from the plurality of lamps, thermal expansion of the metallic plate causes the outer diameter of the metallic plate to contact the inner surface of the housing.

19. The electrostatic chuck of claim 17, further comprising:

a DC power source coupled to the chucking electrode; and an RF power source coupled to the RF bias plate.

20. An electrostatic chuck, comprising:

a dielectric disk having a support surface to support a substrate and an opposing second surface, wherein at least one chucking electrode is disposed within the dielectric disk;

a radio frequency (RF) bias plate disposed below the dielectric disk;

a plurality of lamps disposed below the RF bias plate to heat the dielectric disk;

a metallic plate disposed below the plurality of lamps to absorb heat generated by the plurality of lamps;

a housing containing the RF bias plate, the plurality of lamps, and the metallic plate;

a gap disposed between an outer diameter of the metallic plate and an inner surface of the housing, wherein the gap is sized such that when the metallic plate absorbs heat from the plurality of lamps, thermal expansion of the metallic plate causes the outer diameter of the metallic plate to contact the inner surface of the housing;

a shaft coupled to the second surface of the dielectric disk at a first end of the shaft to support the dielectric disk in a spaced apart relation to the RF bias plate and extending away from the dielectric disk and through the RF bias plate and the metallic plate; and a magnetic rotation assembly coupled to the shaft to rotate the shaft and the dielectric disk with respect to the RF bias plate, the plurality of lamps, and the metallic plate.

* * * * *